(12) United States Patent
Shirakawa

(10) Patent No.: US 9,524,792 B2
(45) Date of Patent: Dec. 20, 2016

(54) SEMICONDUCTOR MEMORY DEVICE AND MEMORY CONTROLLER

(71) Applicant: KABUSHIKI KAISHA TOSHIBA, Tokyo (JP)

(72) Inventor: Masanobu Shirakawa, Chigasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/470,411

(22) Filed: Aug. 27, 2014

(65) Prior Publication Data
US 2015/0262699 A1 Sep. 17, 2015

(30) Foreign Application Priority Data

Mar. 17, 2014 (JP) .................................. 2014-053018

(51) Int. Cl.
*G11C 16/34* (2006.01)
*G11C 16/04* (2006.01)
*G11C 16/16* (2006.01)

(52) U.S. Cl.
CPC ....... *G11C 16/3445* (2013.01); *G11C 16/0483* (2013.01); *G11C 16/16* (2013.01)

(58) Field of Classification Search
CPC .. G11C 16/3445; G11C 16/0483; G11C 16/16
USPC ........................... 365/185.11, 185.17, 185.01
See application file for complete search history.

(56) References Cited

U.S. PATENT DOCUMENTS

| 6,046,936 | A  | * | 4/2000 | Tsujikawa | G11C 11/5621 |
| | | | | | 365/185.03 |
| 6,172,915 | B1 | * | 1/2001 | Tang | G11C 8/12 |
| | | | | | 365/185.22 |
| 6,381,174 | B1 | * | 4/2002 | Roohparvar | G11C 8/12 |
| | | | | | 365/185.09 |
| 6,493,261 | B1 | * | 12/2002 | Hamilton | G11C 16/0475 |
| | | | | | 257/E27.103 |
| 6,654,289 | B2 | * | 11/2003 | Roohparvar | G11C 8/12 |
| | | | | | 365/185.11 |
| 6,862,223 | B1 | * | 3/2005 | Lee | H01L 27/11524 |
| | | | | | 257/E27.103 |
| 7,009,889 | B2 | * | 3/2006 | Tran | G11C 16/3468 |
| | | | | | 365/185.17 |

(Continued)

FOREIGN PATENT DOCUMENTS

JP 2011-258289 A 12/2011

OTHER PUBLICATIONS

Taiwanese Office Action dated Nov. 13, 2015 in counterpart Taiwanese Patent Application No. 103123365.

(Continued)

*Primary Examiner* — Vu Le
*Assistant Examiner* — Sung Cho
(74) *Attorney, Agent, or Firm* — Patterson & Sheridan, LLP

(57) ABSTRACT

A semiconductor memory device includes a plurality of string units, each of which includes a plurality of strings of memory cells connected in series, a controller configured to perform an erase operation on the string units, the erase operation including an erase verify operation that is performed per string unit, and a control circuit including a register that stores erase characteristic for at least one of the string units. The control circuit is configured to output the erase characteristic in response to a command from a memory controller.

12 Claims, 11 Drawing Sheets

(56) References Cited

U.S. PATENT DOCUMENTS

| | | | | |
|---|---|---|---|---|
| 7,385,851 B1* | 6/2008 | Park | G11C 16/0475 | 365/185.17 |
| 7,450,433 B2* | 11/2008 | Wan | G11C 8/08 | 365/185.17 |
| 7,499,338 B2* | 3/2009 | Ito | G11C 16/3468 | 365/185.17 |
| 7,916,538 B2* | 3/2011 | Jeon | G11C 11/005 | 365/132 |
| 8,938,655 B2* | 1/2015 | Hamilton | G11C 16/10 | 365/185.01 |
| 2005/0111259 A1* | 5/2005 | Fukuda | G11C 16/16 | 365/185.11 |
| 2007/0230249 A1* | 10/2007 | Miyaki | G11C 16/3436 | 365/185.22 |
| 2009/0296475 A1* | 12/2009 | Hemink | G11C 16/3418 | 365/185.17 |
| 2010/0259987 A1* | 10/2010 | Lee | G11C 16/16 | 365/185.17 |
| 2010/0277983 A1* | 11/2010 | Mokhlesi | G11C 11/5635 | 365/185.17 |
| 2013/0016561 A1* | 1/2013 | Nam | H01L 27/11556 | 365/185.11 |
| 2013/0070527 A1* | 3/2013 | Sabbag | G11C 16/14 | 365/185.11 |
| 2013/0094294 A1* | 4/2013 | Kwak | H01L 27/1157 | 365/185.03 |
| 2013/0100737 A1* | 4/2013 | Kwak | H01L 27/1157 | 365/185.11 |
| 2013/0265825 A1* | 10/2013 | Lassa | G06F 3/0619 | 365/185.11 |
| 2013/0279256 A1* | 10/2013 | Costa | G11C 5/02 | 365/185.17 |
| 2013/0336061 A1* | 12/2013 | Kim | G11C 16/0483 | 365/185.11 |
| 2014/0063949 A1* | 3/2014 | Tokiwa | G11C 16/16 | 365/185.11 |
| 2014/0153333 A1* | 6/2014 | Avila | G11C 16/3445 | 365/185.11 |
| 2014/0241092 A1* | 8/2014 | Ha | G11C 29/00 | 365/218 |
| 2014/0269069 A1* | 9/2014 | D'Abreu | G11C 16/16 | 365/185.11 |
| 2015/0003150 A1* | 1/2015 | Aritome | G11C 16/3427 | 365/185.02 |
| 2015/0221388 A1* | 8/2015 | Lee | G11C 16/3445 | 365/185.11 |

OTHER PUBLICATIONS

TW Office Action dated Aug. 8, 2016 for Application No. 103123365.

* cited by examiner

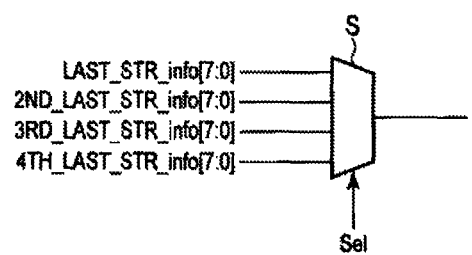

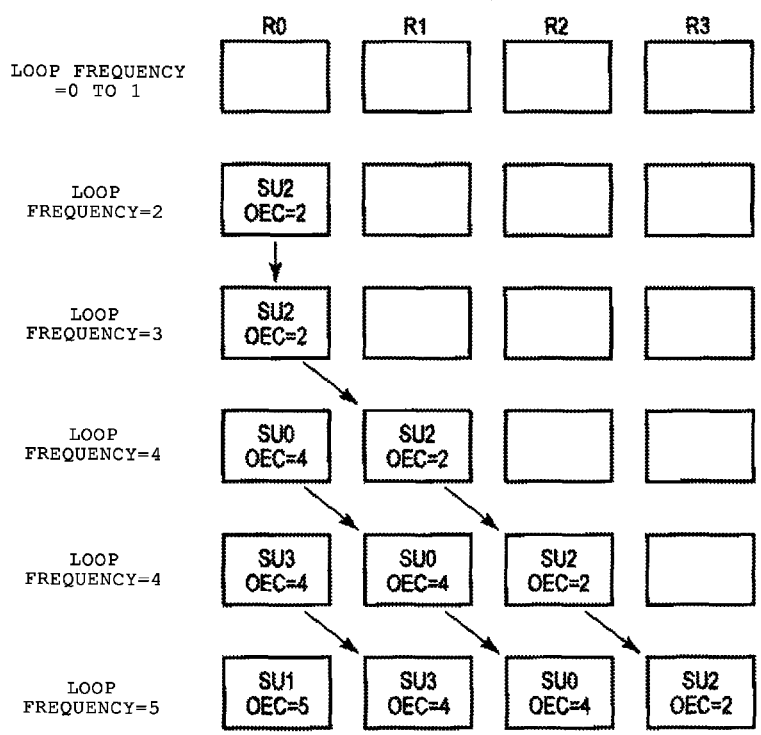

SEMICONDUCTOR MEMORY DEVICE AND MEMORY CONTROLLER

CROSS-REFERENCE TO RELATED APPLICATION

This application is based upon and claims the benefit of priority from Japanese Patent Application No. 2014-053018, filed Mar. 17, 2014, the entire contents of which are incorporated herein by reference.

FIELD

Embodiments described herein relate generally to a semiconductor memory device and a memory controller.

BACKGROUND

A NAND flash memory in which memory cells are three-dimensionally arranged is known.

DESCRIPTION OF THE DRAWINGS

FIG. 6 is a circuit diagram illustrating another portion of the last string register according to the first embodiment.

FIG. 7 is a diagram illustrating the relationship between a string unit and an erase loop frequency according to the first embodiment.

FIG. 8 is a schematic diagram illustrating the last string register according to the first embodiment.

DETAILED DESCRIPTION

Figure 1:
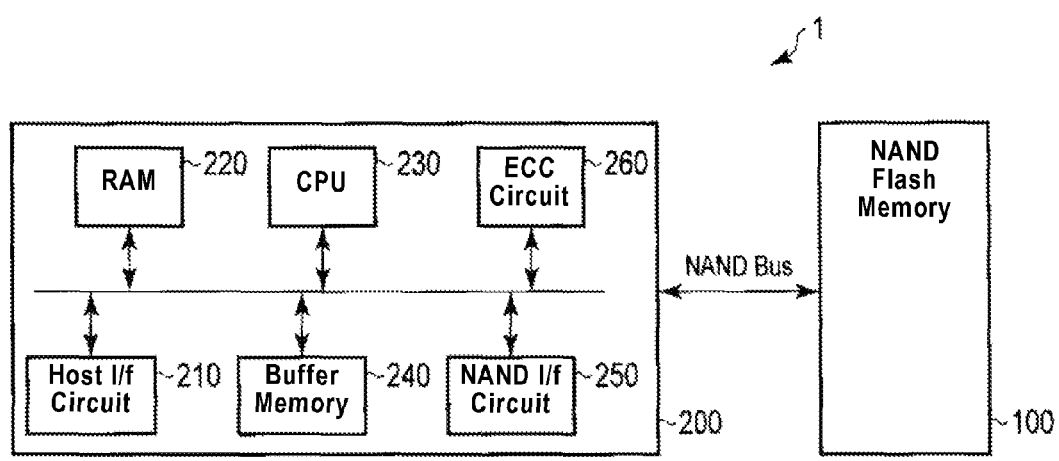
FIG. 1 is a block diagram illustrating a memory system according to a first embodiment.

The present embodiment now will be described more fully hereinafter with reference to the accompanying drawings, in which various embodiments are illustrated. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompass both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments are described herein with reference to cross sections and perspective illustrations that are schematic illustrations of embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

A semiconductor memory device which is capable of improving performance and a memory controller are provided.

In general, according to one embodiment, there is provided a semiconductor memory device including a plurality of string units, each of which includes a plurality of strings of memory cells connected in series, a controller configured to perform an erase operation on the string units, the erase operation including an erase verify operation that is performed per string unit, and a control circuit including a register that stores erase characteristic for at least one of the string units. The control circuit is configured to output the erase characteristic in response to a command from a memory controller.

Hereinafter, embodiments will be described with reference to the accompanying drawings. Meanwhile, common reference numerals are given to components having the same functions and configurations in the description below.

1. First Embodiment

A semiconductor memory device and a memory controller according to a first embodiment will be described. Hereinafter, a 3-dimensional stacked NAND flash memory, in which memory cells are stacked on an upper side of a semiconductor substrate, will be described as the semiconductor memory device.

1.1 Configuration

1.1.1 Configuration of Memory System

First, the configuration of a memory system which includes a semiconductor memory device according to an embodiment will be described with reference to FIG. 1. FIG. 1 is a block diagram illustrating the memory system according to the embodiment.

As illustrated in the drawing, a memory system 1 includes a NAND flash memory 100 and a controller 200 as illustrated in the drawing. The controller 200 and the NAND flash memory 100 may be integrated as a single semiconductor device through. A memory card, such as an SD™ card or a Solid State Drive (SSD) may be provided as an example thereof.

The NAND flash memory 100 includes a plurality of memory cells, and stores data in a non-volatilization manner. The configuration of the NAND flash memory 100 will be described in detail below.

The controller 200 instructs the NAND flash memory 100 to read, write, erase, or the like in response to an instruction from an external host equipment. In addition, the controller 200 manages a memory space of the NAND flash memory 100.

The controller 200 includes a host interface circuit 210, a built-in memory (RAM) 220, a processor (CPU) 230, a buffer memory 240, a NAND interface circuit 250, and an ECC circuit 260.

The host interface circuit 210 is connected to the host equipment through a controller bus, and communicates with the host equipment. Further, the host interface circuit 210 transmits an instruction and data, which are received from the host equipment, to the CPU 230 and the buffer memory 240, respectively. In addition, the host interface circuit 210 transmits data in the buffer memory 240 to the host equipment in response to the instruction of the CPU 230.

The NAND interface circuit 250 is connected to the NAND flash memory 100 through a NAND bus, and communicates with the NAND flash memory 100. Further, the NAND interface circuit 250 transmits the instruction, which is received from the CPU 230, to the NAND flash memory 100. In addition, when write is performed, the NAND interface circuit 250 transmits write data in the buffer memory 240 to the NAND flash memory 100. Further, when data is read, the NAND interface circuit 250 transmits data which is read from the NAND flash memory 100 to the buffer memory 240.

The CPU 230 controls the entire operation of the controller 200. For example, when the CPU 230 receives a write instruction from the host equipment, the CPU 230 issues the write instruction based on a NAND interface in response thereto. When the CPU 230 receives a read instruction from the host equipment, the CPU 230 issues the read instruction based on a NAND interface in response thereto. When the CPU 230 receives an erase instruction from the host equipment, the CPU 230 issues the erase instruction based on a NAND interface in response thereto. In addition, the CPU 230 performs various processes, such as wear leveling, in order to manage the NAND flash memory 100. Further, the CPU 230 performs various calculations. For example, the CPU 230 performs a data encryption process, a randomization process, and the like.

The ECC circuit 260 performs a data error checking and correcting (ECC) process. That is, when data is written, the ECC circuit 260 generates parity based on write data. When data is read, the ECC circuit 260 detects an error by generating a syndrome from the parity, and corrects the error. Meanwhile, the CPU 230 may include the function of the ECC circuit 260.

The built-in memory 220 is, for example, a semiconductor memory such as a DRAM, and is used as the work area of the CPU 230. Further, the built-in memory 220 holds firmware, various management tables, and the like in order to manage the NAND flash memory 100.

1.1.2 Configuration of NAND Flash Memory

Subsequently, the configuration of the NAND flash memory 100 will be described.

1.1.2.1 Configuration of Semiconductor Memory Device

Figure 2:
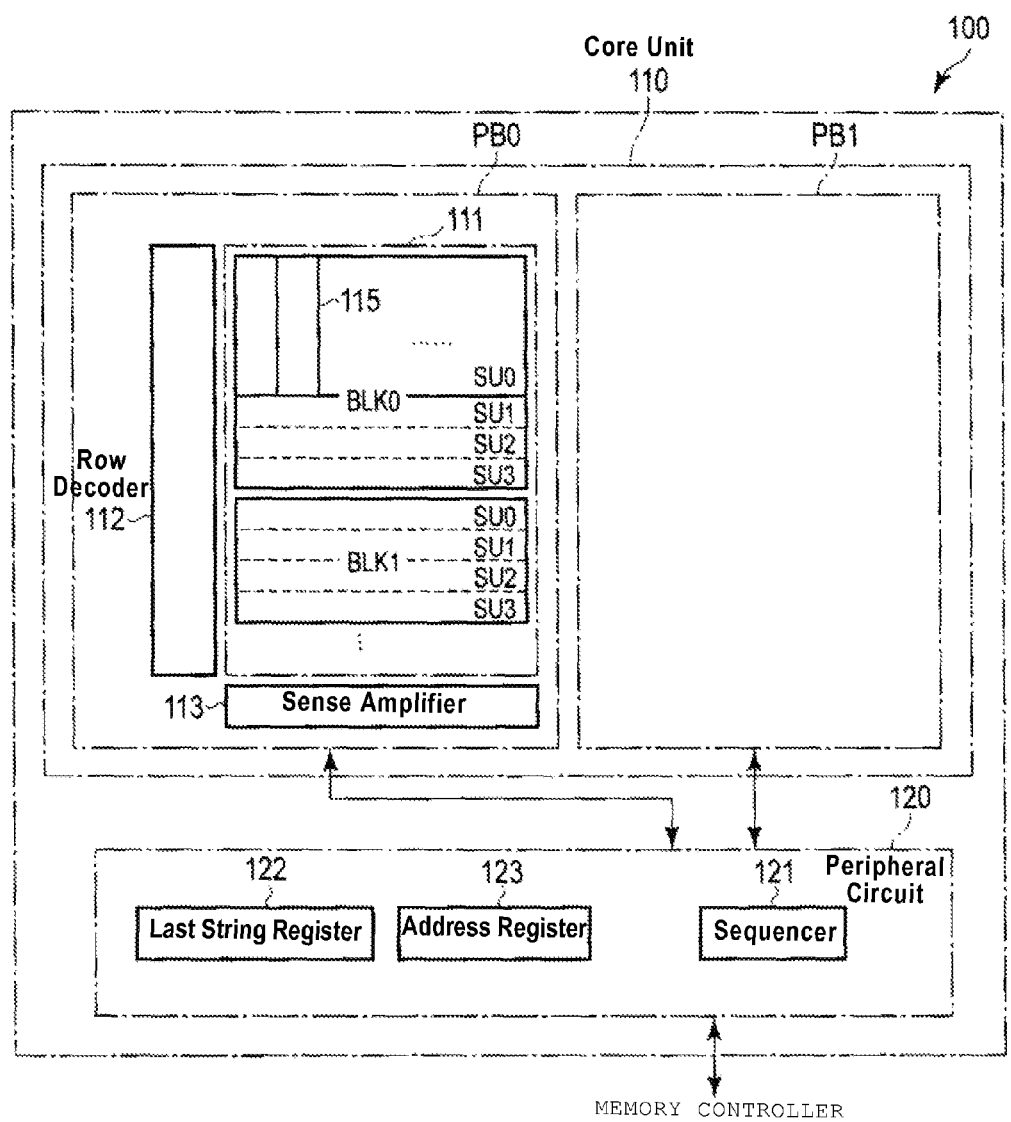
FIG. 2 is a block diagram illustrating a semiconductor memory device according to the first embodiment.

FIG. 2 is a block diagram illustrating the NAND flash memory 100 according to the embodiment. As illustrated in the drawing, the NAND flash memory 100 includes a core unit 110 and a peripheral circuit 120.

The core unit 110 includes a memory cell array 111, a row decoder 112, and a sense amplifier 113.

The memory cell array 111 includes a plurality of planes (in the example, a case of two planes PB0 and PB1 is provided as an example).

The plane PB is a unit that includes memory cells which store data and which write data to the memory cells and read data from the memory cells. The planes PB0 and PB1 are capable of independently performing operations with respect to each other and are capable of simultaneously performing operations.

Each of the planes PB includes the memory cell array 111, the row decoder 112, and the sense amplifier 113.

The memory cell array 111 includes a plurality of blocks BLK (BLK0, BLK1, BLK2, . . . ) each of which is a set of nonvolatile memory cells associated with word lines and bit lines. The block BLK is a data erase unit, and data in the same block BLK is collectively erased. Each block BLK includes a plurality of string units SU (SU0 to SU3) each of which is a set of NAND strings 115 in each of which the memory cells are connected in series. The number of blocks BLK and the number of string units SU in a single block BLK are arbitrary.

The row decoder 112 decodes a block address or a page address, and selects one of word lines of a relevant block. Further, the row decoder 112 applies an appropriate voltage to the selected word line and non-selected word lines.

When data is read from the memory cells, the sense amplifier 113 senses a bit line electrically connected to the memory cells holding the read data. In addition, when data is written, the sense amplifier 113 transmits the write data to the memory cells. The data is read from and written to the memory cell array 111 in units of a plurality of memory cells known as a page.

The row decoder 112 and the sense amplifier 113 read data from the memory cells and write data to the memory cells.

The peripheral circuit 120 includes a sequencer 121, an address register 123, and a last string register 122.

The address register 123, for example, receives an address signal from the controller 200, and temporally holds the received address signal. The last string register 122 identifies a string unit (last string unit) which is determined to have successfully erased during the last erase operation performed on the block. The string unit is identified in the register by a string address, and an address indicative of the last string unit is referred to as a last string address below. The last string address will be described in detail later.

The sequencer 121 controls the entire operation of the NAND flash memory 100.

1.1.2.2 Configuration of Memory Cell Array 111

Figure 3:
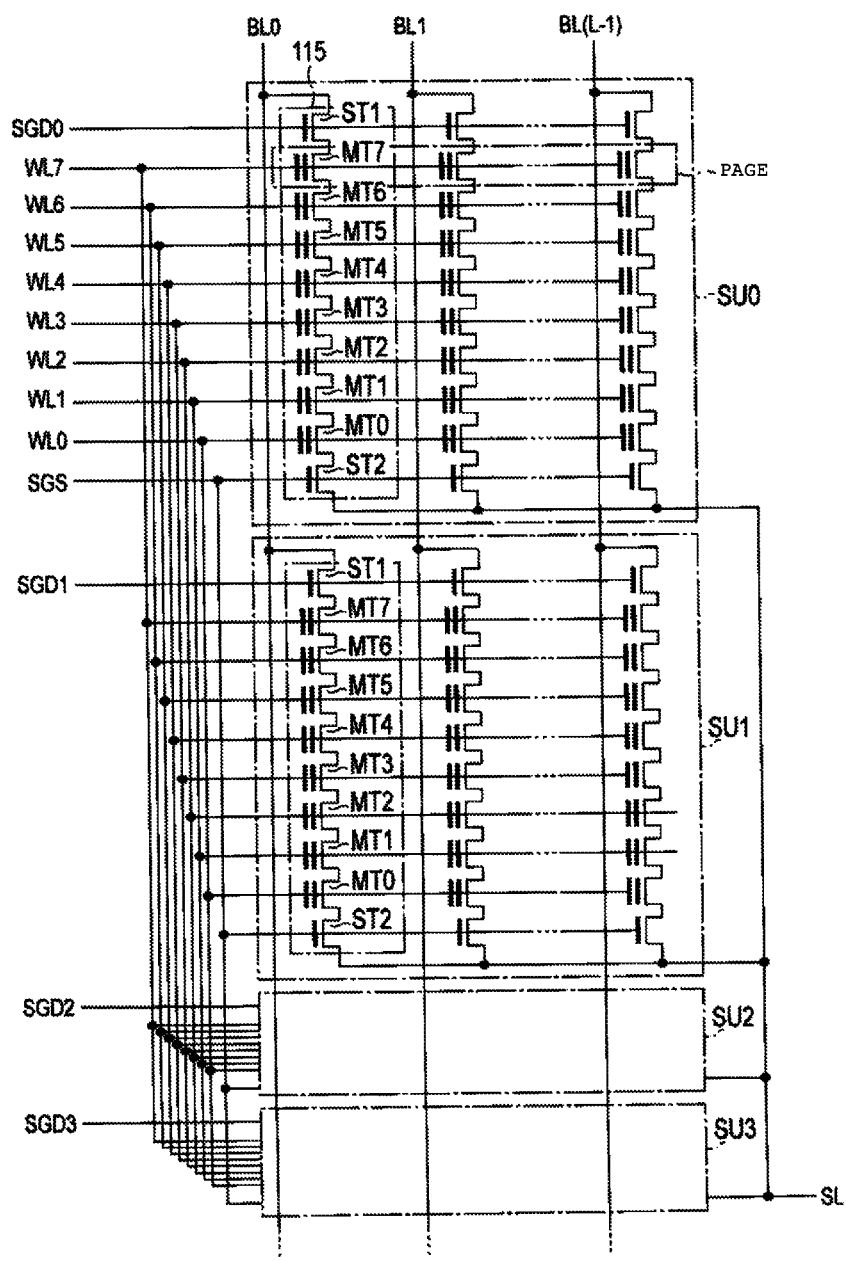
FIG. 3 is a circuit diagram illustrating a memory cell array according to the first embodiment.

The configuration of the memory cell array 111 will be described in detail below. FIG. 3 is a circuit diagram illustrating one of the blocks BLK; the other blocks BLK have the same configurations.

As illustrated in the drawing, the block BLK includes, for example, four string units SU (SU0 to SU3). In addition, each of the string units SU includes a plurality of NAND strings 115.

Each of the NAND strings 115 includes, for example, eight memory cell transistors MT (MT0 to MT7), and select transistors ST1 and ST2. Each of the memory cell transistors MT includes a stacked gate, which includes a control gate and a charge storage layer, and holds data in non-volatilization manner. Meanwhile, the number of memory cell transistors MT is not limited to eight, and may be 16, 32, 64, 128, or the like, that is, any number. The memory cell transistors MT are disposed between the select transistors ST1 and ST2 such that the current paths thereof are connected in series. The current path of the memory cell transistor MT7 which is on one end side of the serial connection is connected to one end of the current path of the select transistor ST1, and the current path of the memory cell transistor MT0 which is on the other end side is connected to one end of the current path of the select transistor ST2.

The gates of the select transistors ST1 of the respective string units SU0 to SU3 are commonly connected to respective select gate lines SGD0 to SGD3. In contrast, the gates of the plurality of select transistors ST2 which are in the same block are commonly connected to the same select gate line SGS, and the control gates of the respective memory cell transistors MT0 to MT7 in the same block BLK0 are commonly connected to word lines WL0 to WL7, respectively. It is apparent that the select transistors ST2 in the respective string units SU may be connected to separate select gate lines SGS0 to SGS3, similarly to the select transistors ST1.

In addition, from among the NAND strings 115 which are disposed in a matrix shape in the memory cell array 111, the other ends of the current paths of the select transistors ST1 of the NAND strings 115 in the same row are commonly connected to any one of bit lines BL (BL0 to BL(L−1), (L−1) is a natural number which is equal to or greater than 1). That is, the bit lines BL commonly connect the NAND strings 115 between the plurality of blocks BLK. In addition, the other ends of the current paths of the select transistors ST2 are commonly connected to a source line SL. The source line SL is commonly connected to, for example, the NAND strings 115 between the plurality of blocks.

As described above, the data of the memory cell transistors MT in the same block BLK is collectively erased. In contrast, data is collectively read and written with regard to the plurality of memory cell transistors MT which are commonly connected to any one of the word lines WL in any one of the string units SU of any one of the blocks BLK. The unit is called a "page".

Figure 4:
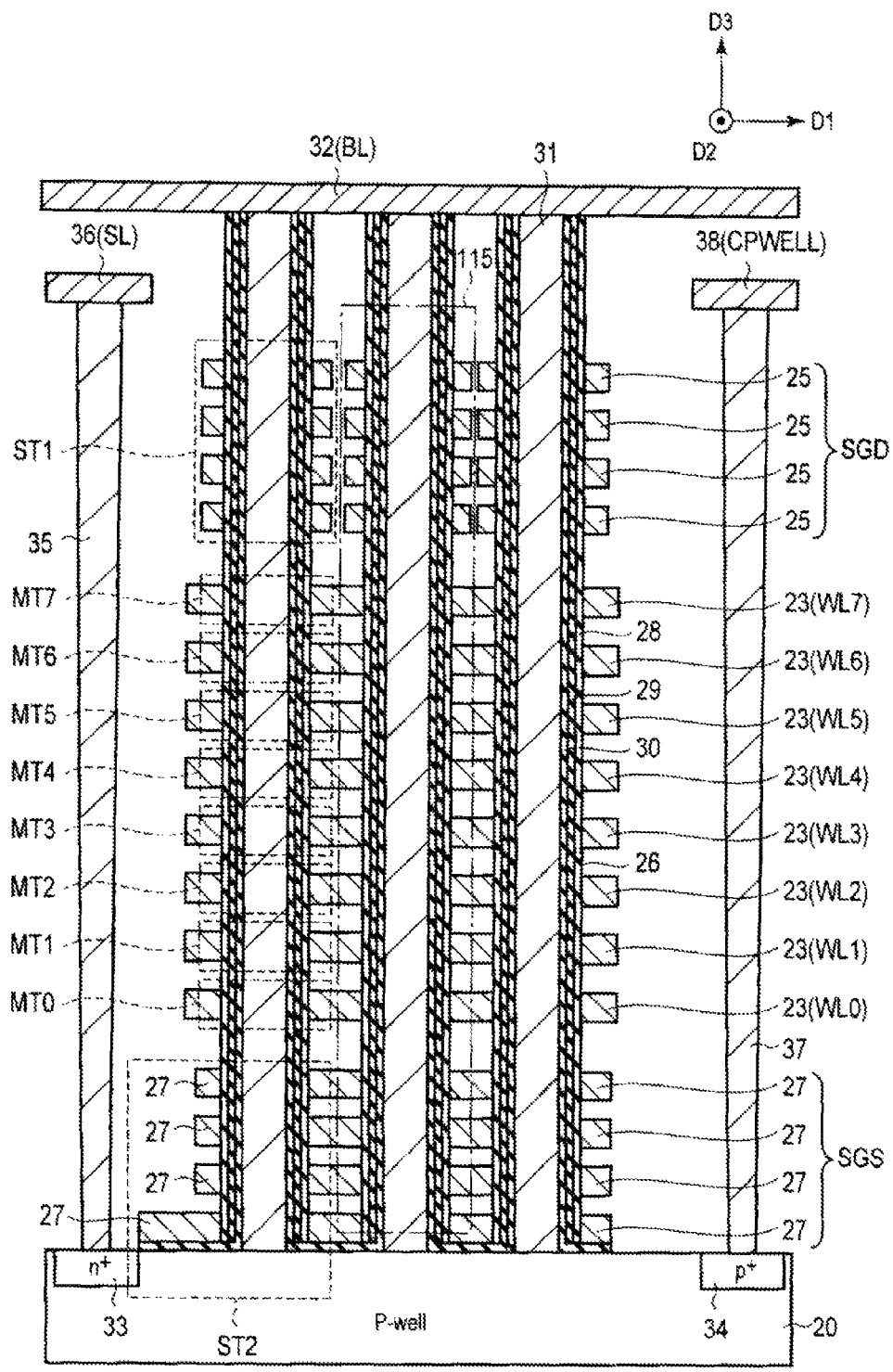
FIG. 4 is a cross-sectional view illustrating an example of a NAND string according to the first embodiment.

FIG. 4 is a cross-sectional view illustrating a partial area of the memory cell array 111 according to the embodiment. As illustrated in the drawing, the plurality of NAND strings 115 are formed on a p-type well region 20. That is, on the well region 20, a plurality of wire layers 27 which function as the select gate lines SGS, a plurality of wire layers 23 which function as the word lines WL, and a plurality of wire layers 25 which function as the select gate lines SGD are formed.

Further, a memory hole 26 which reaches the well region 20 through the wire layers 25, 23, and 27 is formed. A block insulating film 28, a charge storage layer 29 (insulating film), and a gate insulating film 30 are sequentially formed on the side surface of the memory hole 26. Further, a conductive film 31 is embedded in the memory hole 26. The conductive film 31 functions as the current path of the NAND string 115, and is an area in which a channel is formed when the memory cell transistors MT and the select transistors ST1 and ST2 are operated.

In each NAND string 115, the wire layers 27 which are provided in plural (in the example, 4 layers) are electrically connected in common and are connected to the same select gate line SGS. That is, the four-layered wire layers 27 substantially function as a gate electrode of a single select transistor ST2. This is the same as in the select transistor ST1 (four-layered select gate line SGD).

In such a configuration, in each NAND string 115, the select transistor ST2, the plurality of memory cell transistors MT, and the select transistor ST1 are sequentially stacked on the well region 20.

Meanwhile, in the example of FIG. 4, the select transistors ST1 and ST2 include the charge storage layers 29 similarly to the memory cell transistors MT. However, the select transistors ST1 and ST2 do not substantially function as memory cells which hold data but function as switches. At this time, thresholds which cause the select transistors ST1 and ST2 to be turned on or off may be controlled by injecting charges into the charge storage layers 29.

A wire layer 32 which functions as the bit line BL is formed on the upper end of the conductive film 31. The bit line BL is connected to the sense amplifier 113.

Further, an n+ dopant diffusion layer 33 and a p+ dopant diffusion layer 34 are formed on the surface of the well region 20. A contact plug 35 is formed on the diffusion layer 33, and a wire layer 36 which functions as the source line SL is formed on the contact plug 35. In addition, a contact plug 37 is formed on the diffusion layer 34, and a wire layer 38 which functions as a well wiring CPWELL is formed on the contact plug 37. The wire layers 36 and 38 are formed on a layer which is an upper layer than the select gate line SGD and is a lower layer than the wire layer 32.

The above configuration is disposed in plural in the depth direction of a paper in which FIG. 4 is illustrated, and the string units SU are formed by sets of the plurality of NAND strings 115 which are disposed in the depth direction. In addition, the wire layers 27, which function as the plurality of select gate lines SGS included in the same string unit SU, are commonly connected to each other. That is, the gate insulating film 30 is formed even on the well region 20 between the adjacent NAND strings 115, the wire layer 27 and the gate insulating film 30 which are adjacent to the diffusion layer 33 are formed up to the vicinity of the diffusion layer 33.

Therefore, when the select transistor ST2 is caused to be an on state, the channel thereof electrically connects the memory cell transistor MT0 to the diffusion layer 33. In addition, it is possible to give a potential to the conductive film 31 by applying a voltage to the well wiring CPWELL.

Meanwhile, other configurations may be used as the configuration of the memory cell array 111. That is, the configuration of the memory cell array 111 is disclosed in, for example, U.S. patent application Ser. No. 12/407,403 "Three dimensional stacked nonvolatile semiconductor memory" which is filed on Mar. 19, 2009, U.S. patent application Ser. No. 12/406,524 "Three dimensional stacked nonvolatile semiconductor memory" which is filed on Mar. 18, 2009, U.S. patent application Ser. No. 12/679,991 "Nonvolatile semiconductor storage device and method of manufacturing the same" which is filed on Mar. 25, 2010, and U.S. patent application Ser. No. 12/532,030 "Semiconductor memory and method for manufacturing the same" which is filed on Mar. 23, 2009. The entire disclosures of all of these patent applications are incorporated by reference herein.

1.1.2.3 Last String Register 122

Figure 5:
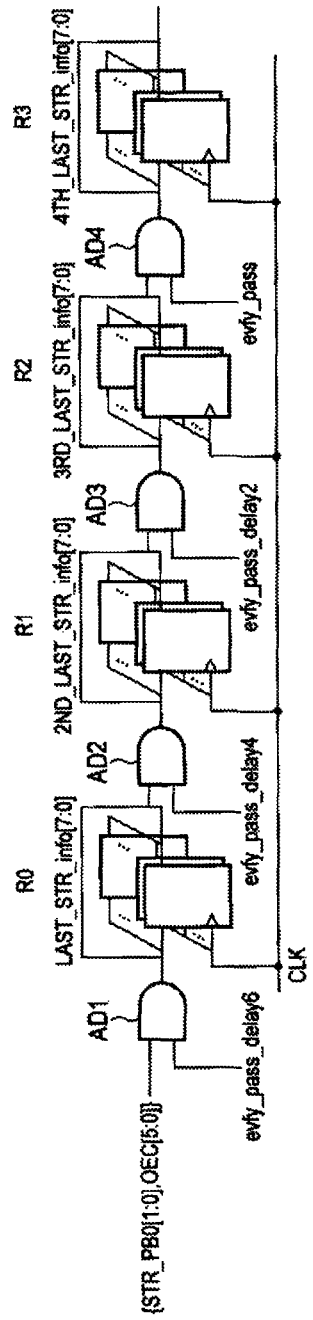
FIG. 5 is a circuit diagram illustrating a portion of a last string register according to the first embodiment.

The configuration of the last string register 122 will be described below. FIGS. 5 and 6 show a portion of the last string register 122. The last string register 122 includes the configuration of FIGS. 5 and 6 for each plane PB.

As illustrated in FIG. 5, the last string register 122 includes four register units R0 to R3. The number of register units R is identical to the number of string units SU in a single block BLK. In the description below, an example in which a single block BLK includes four string units will be described using the four register units R0 to R3 in the last string register 122. Each of the register units R0 to R3 includes a plurality of register elements, and holds information which has a plurality of bits. Further, each of the register units includes the following configuration.

That is, an AND gate AD1 receives a signal {STR_PB [1:0], OEC [5:0]} from the sequencer 121. The signal {STR_PB [1:0], OEC [5:0]} indicates a string address in the bits STR_PB [1:0] and indicates the loop frequency in the bits OEC [5:0]. The loop frequency indicates a repetition frequency of a process which is repeatedly performed when erase is performed. Each loop includes a set of voltage application and erase verification which are performed to erase a relevant element. That is, in each loop, the sequencer 121 first applies various voltages to the source line SL, the bit lines BL, the select gate lines SGD and SGS, and the word lines WL in order to perform the erase operation. Subsequently, in each loop, the sequencer 121 performs erase verification. The erase verification includes a step of determining whether or not erase is completed for each string unit SU. When the erase operation is being performed, the sequencer 121 indicates a string address using the bit STR_PB[1:0], and outputs the signal {STR_PB [1:0], OEC [5:0]} which indicates the current loop frequency using the bit OEC [5:0].

In addition, the AND gate AD1 receives a signal evfy_pass_delay6. The signal evfy_pass_delay6 is a signal which is acquired by delaying a signal evfy_pass. The signal evfy_pass is a signal which is output by the sequencer 121 whenever the string unit SU which becomes an erase target passes the erase verification. Further, in the area of the last string register, which is not illustrated in the drawing, the signal evfy_pass_delay6 is generated by delaying the signal evfy_pass using a delay circuit or the like. Meanwhile, a signal evfy_pass_delay2 which will be described later is a signal which is delayed by two cycles of a clock CLK, a signal evfy_pass_delay4 is a signal which is further delayed by two cycles of the clock CLK (that is, a signal which is acquired by delaying the evfy_pass by four cycles of CLK), and the signal evfy_pass_delay6 is a signal which is further delayed by two cycles of the clock CLK (that is, a signal which is acquired by delaying the evfy_pass by six cycles of CLK). The AND gate AD1 outputs the signal {STR_PB [1:0], OEC [5:0]} while the signal evfy_pass_delay6 is at a high level. The signal {STR_PB [1:0], OEC [5:0]} is supplied to the register unit R0. The register unit R0 latches the signal {STR_PB [1:0], OEC [5:0]} at the rising of the clock signal CLK. In addition, the register unit R0 outputs latched data as a signal LAST_STR_info [7:0]. In addition, the signal LAST_STR_info [7:0] is supplied to the input of the register unit R0. Therefore, after latching is performed in the register unit R0, the output of the register unit R0 is continuously provided to the input of the register unit R0 regardless of the output of the AND gate AD1. The clock signal CLK is generated by, for example, a clock signal generation circuit of the peripheral circuit 120.

In addition, the signal LAST_STR_info [7:0] is also provided to an AND gate AD2. In addition, the AND gate AD2 receives the above-described signal evfy_pass_delay4. The AND gate AD2 outputs the signal LAST_STR_info [7:0] while the signal evfy_pass_delay4 is at a high level. The signal LAST_STR_info [7:0] is supplied to the register unit R1. The register unit R1 latches the signal LAST_STR_info [7:0] at the rising of the clock signal CLK. In addition, the register unit R1 outputs latched data as a signal 2ND_LAST_STR_info [7:0]. In addition, the signal 2ND_LAST_STR_info [7:0] is supplied to the input of the register unit R1. Therefore, after latching is performed in the register unit R1, the output of the register unit R1 is continuously supplied to the input of the register unit R1 regardless of the output of the AND gate AD2.

In addition, the signal 2ND_LAST_STR_info [7:0] is also supplied to an AND gate AD3. In addition, the AND gate AD3 receives the above-described signal evfy_pass_delay2. The AND gate AD3 outputs the signal 2ND_LAST_STR_info [7:0] while the signal evfy_pass_delay2 is at a high level. The signal 2ND_LAST_STR_info [7:0] is supplied to the register unit R2. The register unit R2 latches the signal 2ND_LAST_STR_info [7:0] at the rising of the clock signal CLK. In addition, the register unit R2 outputs latched data as a signal 3RD_LAST_STR_info [7:0]. In addition, the signal 3RD_LAST_STR_info [7:0] is supplied to the input of the register unit R2. Therefore, after latching is performed in the register unit R2, the output of the register unit R2 is continuously supplied to the input of the register unit R2 regardless of the output of the AND gate AD3.

In addition, the signal 3RD_LAST_STR_info [7:0] is also supplied to an AND gate AD4. In addition, the AND gate AD4 receives the above-described signal evfy_pass. The AND gate AD4 outputs the signal 3RD_LAST_STR_info [7:0] while the signal evfy_pass is at a high level. The signal 3RD_LAST_STR_info [7:0] is supplied to the register unit R3. The register unit R3 latches the signal 3RD_LAST_STR_info [7:0] at the rising of the clock signal CLK. In addition, the register unit R3 outputs latched data as a signal 4TH_LAST_STR_info [7:0]. In addition, the signal 4TH_LAST_STR_info [7:0] is supplied to the input of the register unit R3. Therefore, after latching is performed by the register unit R3, the output of the register unit R3 is continuously supplied to the input of the register unit R3 regardless of the output of the AND gate AD4.

With the configuration, if the signal evfy_pass is asserted (in the example, "H" level), the data of the register unit R2 is copied to the register unit R3. Further, after two clock cycles, the data of the register unit R1 is copied onto the register unit R2. At this time, data which is originally held in the register unit R2 is transferred into the register unit R3.

After two clock cycles, the data of the register unit R0 is copied onto the register unit R1. After the two clock cycles, information {STR_PB [1:0], OEC [5:0]} which passes the erase verification at that time is set to the register unit R0.

Subsequently, another portion of the last string register 122 will be described with reference to FIG. 6. As illustrated in FIG. 6, the last string register 122 includes a selector S. The selector S receives the signals LAST_STR_info [7:0], 2ND_LAST_STR_info [7:0], 3RD_LAST_STR_info [7:0], and 4TH_LAST_STR_info [7:0]. In addition, the selector S receives a control signal Sel. The control signal Sel includes a register address and a plane address. The register address and the plane address are designated in a string address acquisition command which is received from the controller 200. The string address acquisition command will be described in detail later.

When the received control signal Sel designates the plane PB to which the selector S belongs, the selector S outputs a signal in the register unit R which is specified using a register address in the control signal Sel. That is, the control signal Sel designates any one of the register units R0 to R3. When the register unit R0 is designated, the selector S outputs the signal LAST_STR_info [7:0]. In the same manner, when the register units R1 to R3 are designated, the selector S outputs each of the signals LAST_STR_info [7:0], 2ND_LAST_STR_info [7:0], and 3RD_LAST_STR_info [7:0].

1.2 Operation

Subsequently, with regard to the operations of the NAND flash memory 100 and the memory controller 200 which have the above configurations, the operation of the last string register 122 will be particularly described.

1.2.1 Operation of Last String Register 122

First, the operation of the last string register 122 will be described with reference to FIGS. 7 and 8. As an example, it is assumed that, when an erase operation is performed on an arbitrary block, the loop frequency OEC which is necessary such that the string units SU0 to SU3 pass the erase verification is as expressed in FIG. 7. That is, it is assumed that the string units SU0 to SU3 pass the erase verification on fourth, fifth, second, and fourth loops, respectively. The state of change in data (string unit and OEC) held in the register units R0 to R3 at this time is illustrated in FIG. 8.

The sequencer 121 which receives an erase command from the memory controller 200 performs a loop for erase (voltage application and erase verification). At this time, before the erase is performed, the sequencer 121 resets the register units R0 to R3, and, as a result, the sequencer 121 becomes a state in which the values of the register units R0 to R3 are not held. On the first loop, none of the string units SU pass the erase verification. Therefore, the signal evfy_pass is at a low level, and thus the signal {STR_PB [1:0], OEC [5:0]} is not held in the register unit R0. Therefore, the register units R0 to R3 continue to be empty.

The sequencer 121 further repeats a loop for erase, the string unit SU2 passes the erase verification on the second loop as described above. If so, the sequencer 121 sets the signal evfy_pass to an "H" level. Further, the signal evfy_pass_delay2 is set to the "H" level after two cycles of the clock using the delay circuit which is not illustrated in the drawing, the signal evfy_pass_delay4 is set to the "H" level after four cycles, and the signal evfy_pass_delay6 is set to the "H" level after six cycles. That is, a signal, which indicates that the AND gates AD4, AD3, AD2, and AD1 sequentially pass the erase verification, is input, and data in each of the register units R0 to R3 is shifted. However, at this time point, the register units R0 to R3 are reset, and thus the data held in the register units R1 to R3 is not changed (in other words, null data is transmitted). Since the signal {STR_PB [1:0], OEC [5:0]}, which includes an address specifying the string unit SU2 and a bit row indicating the loop frequency 2, is input to the AND gate AD1 from the sequencer 121, the signal {STR_PB [1:0], OEC [5:0]} is included in the register unit R0 in synchronization with the clock CLK at a point of time that the signal evfy_pass_delay 6 becomes the "H" level. That is, the register unit R0 holds the string address SU2 and the OEC=2.

The sequencer 121 further repeats the loop for erase, and the string unit SU0 passes the erase verification on the fourth loop as described above. If so, the sequencer 121 sets the signal evfy_pass to the "H" level. Further, as described above, the signals evfy_pass_delay2, evfy_pass_delay4, and evfy_pass_delay6 are sequentially set to the "H" level. If so, although data which is held in the register units R2 and R3 is not changed (null data is transmitted), the signal LAST_STR_info [7:0] from the register unit R0 is included in the register unit R1 in synchronization with the clock CLK at a point of time that evfy_pass_delay4 becomes the "H" level. Thereafter, if the signal evfy_pass_delay6 becomes the "H" level, the signal {STR_PB [1:0], OEC [5:0]} is latched in the register unit R0. That is, the register unit R0 holds the string address SU0 and OEC=4 which are verified in the current loop. As described above, whenever the string unit SU passes the verification, the data 3RD_LAST_STR_info [7:0] which is held in the register unit R2 is transmitted to the register unit R3, the data 2ND_LAST_STR_info [7:0] which is held in the register unit R1 is transmitted to the register unit R2 after two cycles, the data LAST_STR_info [7:0] which is held in the register unit R0 is transmitted to the register unit R1 after the two cycles, and the signal {STR_PB0 [1:0], OEC [5:0]} is included in the register unit R0 after the two cycles.

As above, if any one of the string units SU passes the erase verification, the information is first held in the register unit R0. Thereafter, whenever any one of the string units SU passes the erase verification, data in each of the register units R0 to R2 is shifted to each of the register units R1 to R3. In this manner, when data is shifted between the register units R0 to R3, the string units SU, which pass the erase verification, and the loop frequency OEC, which are necessary such that the string units SU pass through the erase verification, are set in the register units R0 to R3 as illustrated in FIG. 8. Further, information, related to the string unit SU which passes the erase verification at the earliest, is held in the register unit R3, and information, related to the string unit SU which passes the erase verification at last, is held in the register unit R0.

Figure 9:
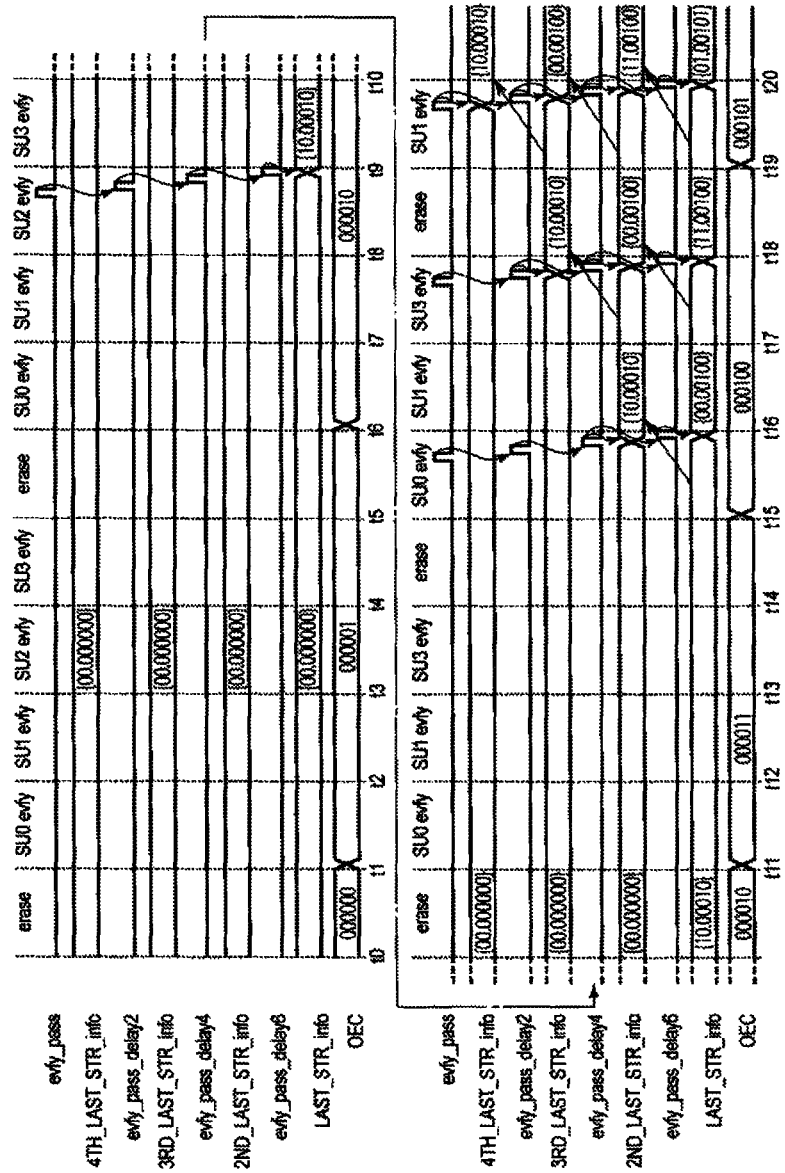
FIG. 9 is a timing chart illustrating various signals in the last string register according to the first embodiment.

FIG. 9 is a timing chart illustrating the change in various signals when the operation is performed in detail.

As illustrated in the drawing, during time t0 to t1, an erase voltage is applied to the word lines WL of an arbitrary block, and a signal OEC is counted up to "000001" (time t1). Thereafter, the erase verification is sequentially performed on the string units SU0 to SU3 (time t1 to t5). At this time, since no string unit SU passes the erase verification, the signal evfy_pass is maintained at an "L" level, and the register units R0 to R3 are maintained in a reset state.

Subsequently, during time t5 to t6, the erase voltage is applied to the word lines WL again, and the signal OEC is counted up to "000010" (time t6). Thereafter, the erase verification is sequentially performed on the string units SU0 to SU3 (time t6 to t10). If so, since only the string unit SU2 passes the erase verification, the sequencer 121 sets the signal evfy_pass to the "H" level (refer to time t8 to t9). In addition, when the signal evfy_pass is delayed in synchronization with the clock CLK, the signals evfy_pass_delay2, evfy_pass_delay4, and evfy_pass_delay6 are sequentially set to the "H" level. Further, at a timing that the signal evfy_pass_delay6 is set to the "H" level, the signal LAST_STR_info is set to {10,00010}. That is, information, which indicates that the string unit SU2 passes the second erase loop, is set in the register unit R0. Subsequently, in time t10 to t11, the erase voltage is applied to the word lines WL again, and the signal OEC is counted up to "000011" (time t11). Thereafter, the erase verification is sequentially performed on the string units SU0, SU1, and SU3 (time t11 to t14). Meanwhile, the sequencer 121 does not cause the string unit SU, which already passed the erase verification, to be a target of the erase verification any more. Therefore, in the erase verification in time t11 to t14, the string unit SU2 which passed the erase verification in the last erase loop is excluded from an erase verification target.

In the loop, since none of the string units SU0, SU1, and SU3 pass the erase verification, the signal evfy_pass is at the "L" level without change, and the data which is held in the register units R0 to R3 is also not changed (that is, data is not transmitted between the register units).

Subsequently, in time t14 to t15, the erase voltage is applied to the word lines WL again, and the signal OEC is counted up to "000100" (time t15). Thereafter, the erase verification is sequentially performed on the string units SU0, SU1, and SU3 (time t15 to t18). If so, first, the string unit SU0 passes the erase verification. Therefore, the sequencer 121 sets the signal evfy_pass to the "H" level (refer to time t15 to t16). In addition, when the signal evfy_pass is delayed in synchronization with the clock CLK, the signals evfy_pass_delay2, evfy_pass_delay4, and evfy_pass_delay6 are sequentially set to the "H" level. As a result, at a timing that the signal evfy_pass_delay4 is set to the "H" level, the signal 2ND_LAST_STR_info is set to {10, 00010}. That is, the data in the register unit R0 is transmitted to the register unit R1. Continuously, at a timing that the signal evfy_pass_delay6 is set to the "H" level, the signal LAST_STR_info is set to {00,00100}. That is, information, which indicates that the string unit SU0 passes the fourth erase loop, is set in the register unit R0.

Further, within the erase loop, the string unit SU3 passes the erase verification. Therefore, the sequencer 121 sets the signal evfy_pass to the "H" level (refer to time t17 to t18). In addition, when the signal evfy_pass is delayed, the signals evfy_pass_delay2, evfy_pass_delay4, and evfy_pass_delay6 are sequentially set to the "H" level. As a result, at a timing that the signal evfy_pass_delay2 is set to the "H" level, the signal 3RD_LAST_STR_info is set to {10, 00010}. That is, data of the register unit R1 is transmitted to the register unit R2. Continuously, at a timing that the signal evfy_pass_delay4 is set to the "H" level, the signal 2ND_LAST_STR_info is set to {00,00100}. That is, the data of the register unit R0 is transmitted to the register unit R1. Continuously, at a timing that the signal evfy_pass_delay6 is set to the "H" level, the signal LAST_STR_info is set to {11,00100}. That is, information, which indicates that the string unit SU3 passes the fourth erase loop, is set in the register unit R0.

Subsequently, in time t18 to t19, the erase voltage is applied to the word lines WL again, and the signal OEC is counted up to "000101" (time t19). Thereafter, the sequencer 121 performs the erase verification on the singular string unit SU0 which does not pass the erase verification (time t19 to t20). If so, the string unit SU0 passes the erase verification. Therefore, the sequencer 121 sets the signal evfy_pass to the "H" level (time t19 to t20). Further, in the same manner, the signals evfy_pass_delay2, evfy_pass_delay4, and evfy_pass_delay6 are sequentially set to the "H" level. As a result, at a timing that the signal evfy_pass is set to the "H" level, the signal 4TH_LAST_STR_info is set to {10, 00010}. That is, the data of the register unit R2 is transmitted to the register unit R3. Continuously, at a timing that the signal evfy_pass_delay2 is set to the "H" level, the signal 3RD_LAST_STR_info is set to {00,00100}. That is, the data of the register unit R1 is transmitted to the register unit R2. In addition, at a timing that the signal evfy_pass_delay4 is set to the "H" level, the signal 2ND_LAST_STR_info is set to {11,00100}. That is, the data of the register unit R0 is transmitted to the register unit R1. At last, at a timing that the signal evfy_pass_delay6 is set to the "H" level, the signal LAST_STR_info is set to {01,00101}. That is, information which indicates that the string unit SU1 passes the fifth erase loop is set in the register unit R0.

From the above results, data of {01,00101}, {11,00100}, {00,00100}, and {10,00010} are held in the respective register units R0 to R3. Therefore, when the register unit R3 is referred to, it is understood that the string unit SU which passes the erase verification for the first time is the string unit SU2 and that the loop frequency is two. In addition, when the register unit R2 is referred to, it is understood that the string unit SU which passes the erase verification for the second time is the string unit SU0 and that the loop frequency is four. Further, when the register unit R1 is referred to, it is understood that the string unit SU which passes the erase verification for the third time is the string unit SU3 and that the loop frequency is four. Further, when the register unit R0 is referred to, it is understood that the string unit SU which passes the erase verification for the last time is the string unit SU1 and that the loop frequency is five.

1.2.2 Operation of Memory Controller 200

Figure 10:
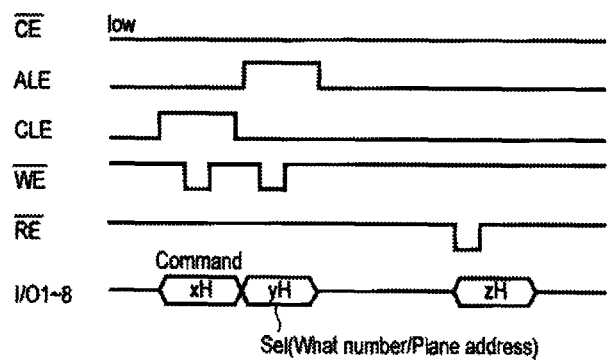
FIG. 10 is a timing chart illustrating various signals acquired when a status is read according to the first embodiment.

Subsequently, the operation of the memory controller 200 performed when the last string address is acquired will be described with reference to FIG. 10. FIG. 10 is a timing chart illustrating a chip enable signal /CE, an address latch enable signal ALE, a command latch enable signal CLE, a write enable signal /WE, a read enable signal /RE, and an input/output signal I/O, which are transmitted and received on the NAND bus.

Meanwhile, /CE is a signal for enabling the NAND flash memory 100 and is enabled and asserted at a low level. ALE is a signal for providing notification that the input signal is an address signal to the NAND flash memory. CLE is a signal for providing notification that the input signal is a command to the NAND flash memory. /WE is a signal for causing the input signal to be included in the NAND flash memory 100.

For example, if the erase operation is terminated in the NAND flash memory 100 (it is possible to check by issuing a status read command to the NAND flash memory 100), the CPU 230 of the NAND flash memory 100 issues a dedicated string address acquisition command "xH" which is prepared separately from the status read command, and outputs the command "xH" to the NAND flash memory 100 as an input/output signal, as illustrated in FIG. 10. The command "xH" is a command for acquiring the last string information. In addition, the CPU 230 asserts CLE ("H" level) and asserts /WE ("L" level). Therefore, the command "xH" is stored in the command register of the NAND flash memory 100, which is not illustrated in the drawing.

Continuously, the CPU 230 issues an address signal "yH" which designates the address of the plane PB for acquiring the string address and the register unit R0, and transmits the address signal "yH" to the NAND flash memory 100. At this time, ALE is asserted ("H" level) and /WE is asserted. The address signal "yH" is first stored in, for example, the address register 123. Thereafter, according to the instruction of the sequencer 121, the address signal "yH" is supplied to the selector S in the last string register 122, which corresponds to the plane PB corresponding to the address signal "yH", as the signal Sel.

As a result, the selector S selects string information corresponding to the address signal "yH". As an example, in FIG. 7, each of the signals LAST_STR_info [7:0] to 4TH_LAST_STR_info [7:0] is associated with signals "00", "01", "10", and "11". Further, if any one of "00" to "11" is input as the signal Sel, the selector S outputs any one of corresponding signals LAST_STR_info [7:0] to 4TH_LAST_STR_info [7:0]. In the example in FIG. 9, when the signal Sel="00" is input, the selector S selects the output of the register unit R0 which holds last string information.

Thereafter, it is possible for the memory controller 200 to acquire last string information (SU1 and OEC=5 in the examples in FIGS. 7 to 9) which is selected by the selector S in such a way as to assert /RE ("L" level).

1.3 Advantages According to Embodiment

In the 3-dimensional stacked NAND flash memory semiconductor memory device as illustrated in FIG. 2 according to the embodiment, if data is erased and then the erase verification is first performed on all of the string units SU of the erase target block and all of the string units SU pass the erase verification, it is determined that the erase verification of the erase target block is passed.

However, if the erase properties (cell properties) of the string units SU of each block BLK do not greatly vary, it is possible to determine that the erase target block passes the erase verification based on the fact that a single string unit SU of the erase target block passes the erase verification. In order to enable this, it is possible to prepare a mode in which the memory controller 200 performs the erase verification on predetermined one or plurality of string units SU which are held in, for example, the ROM.

However, when the string unit SU, which is the target of the erase verification, has a property in which the string unit SU extremely rapidly or slowly passes the erase verification, it is hard to exactly know a timing that the erase target block passes the erase verification.

At this point, in the configuration according to the embodiment, the NAND flash memory 100 includes the last string register 122. Further, it is possible for the memory controller 200 to know the number of repeated sequences of each string unit SU in order to pass the erase verification from the last string register 122. That is, it is possible to acquire information which indicates an easiest string unit SU to be erased and a most difficult string unit SU to be erased.

Therefore, it is possible to appropriately select a string unit SU which becomes an erase verification target based on the information. That is, for example, it is possible to select the most difficult string unit SU to be erased as an erase verification target. More specifically, it is possible for the memory controller 200 to associate a block with a last string unit and to store the block and the last string unit, and to further appropriately manage the NAND flash memory 100. Description will be made in detail in a second embodiment with regard to this point.

2. Second Embodiment

Subsequently, a semiconductor memory device and a memory controller according to a second embodiment will be described. The embodiment repeats the erase operation of the first embodiment and takes into consideration a string unit that becomes a bad string. Hereinafter, only the difference between the first embodiment and the second embodiment will be described.

2.1 Deterioration in Memory Cell Transistors

Figure 11:
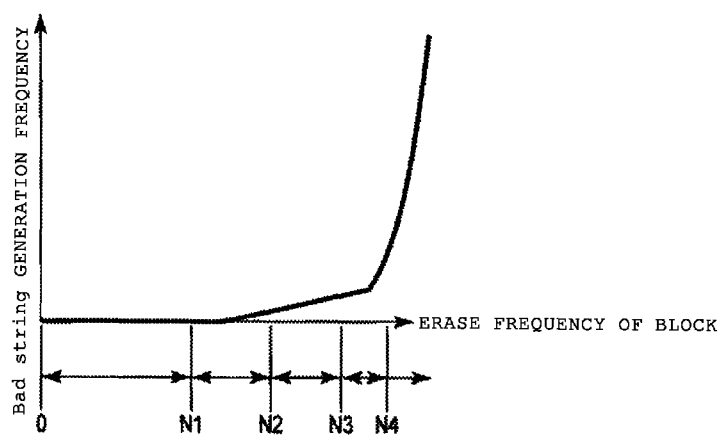
FIG. 11 is a graph illustrating a relationship between an erase frequency and a bad string generation frequency.

FIG. 11 is a graph illustrating the relationship between an erase frequency of a block and the number of bad strings. A bad string is a string unit SU which is not usable because the number of inferior NAND strings, which are generated when the memory cell transistors MT become deteriorated, exceeds a certain number. As illustrated in the drawing, the number of times a bad string is generated increases with the increase in the erase frequency.

For example, a bad string is rarely generated when the erase frequency is in a range of 0 to N1. However, a bad string is generated with gradually increasing frequency in a range of N1 to N4 and with rapidly increasing frequency after N4.

In the embodiment, a last string is updated while taking the erase frequency of the block into consideration.

2.2 Operation of Memory System 1

Figure 12:
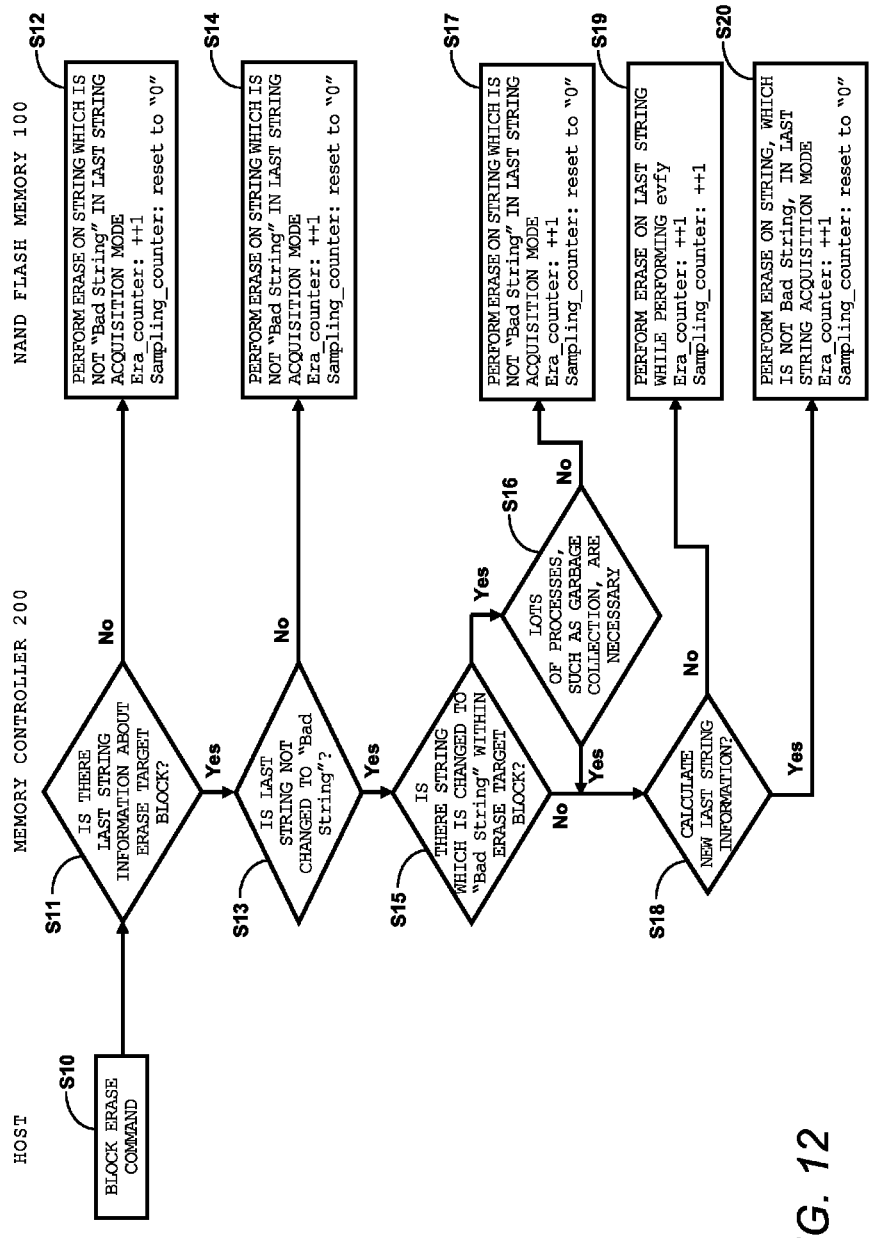
FIG. 12 is a flowchart illustrating an erase operation according to a second embodiment.

An operation of a memory system 1 according to the embodiment will be described with reference to FIG. 12. FIG. 12 is a flowchart illustrating the operation of the memory system 1, and the operation for each of the host equipment, the memory controller 200, and the NAND flash memory 100 is separately shown. Meanwhile, the memory controller 200 acquires bad string information from the ROM fuse of the NAND flash memory 100 when, for example, power is on.

As illustrated in FIG. 12, the host instructs the memory controller 200 to erase a certain block BLK (step S10). If so, the memory controller 200 determines whether or not last string information of an erase target block is held (step S11).

The memory controller 200, for example, holds a table in the RAM 220. The table holds the last string information, an erase frequency Era_counter, and an erase frequency Sampling_counter (referred to as a sampling frequency) acquired after erase is performed in a last string acquisition mode for each block. Therefore, when the CPU 230 accesses the table, it is possible to determine whether or not the last string information of the erase target block is valid.

If the last string information is not included, that is, not acquired (No in step S11), the memory controller 200 issues an erase command together with a last string acquisition directive command to the NAND flash memory 100. In the last string acquisition directive command, if a bad string is included in an erase target block, the bad string is removed from the target, the loop frequency of which is monitored. That is, the last string acquisition directive command instructs that the strings of the erase target block, excluding any bad strings, become targets.

If the command is received, the NAND flash memory 100 performs erase and acquires the last string information of the erase target block (step S12). That is, the erase verification is performed on all of the string units of the erase target block, which are designated by the last string acquisition directive command, a loop for data erase is repeated, and the last string information is acquired in the manner described above in conjunction with the first embodiment. In addition, the memory controller 200 increases an erase count Era_counter with regard to the erase target block in the table by 1, and resets a sampling count Sampling_counter to 0. Further, if the erase is terminated in the NAND flash memory 100, the memory controller 200 reads status data by issuing a status read command, and reads the last string information by issuing the dedicated acquisition command "xH" described in FIG. 10.

In step S11, if the last string of the erase target block has been already acquired (Yes in step S11), the memory controller 200 determines whether or not the last string has changed to a bad string after shipment (step S13). The memory controller 200 treats a memory string including a memory cell in which data could not be written properly (write detect) as this bad string.

When a string which is previously registered as the latest becomes a bad string as a result of later use, it is necessary to calculate a new last string. Therefore, when the last string has changed to a bad string (No in step S13), the memory controller 200 issues the erase command together with the last string acquisition directive command to the NAND flash memory. The last string acquisition directive command designates a string which is not a bad string.

The NAND flash memory 100 which received the last string acquisition directive command and the erase command, performs data erase, and acquires the newest last string information (step S14). If the erase is terminated, the memory controller 200 reads status data, which includes the last string information, from the NAND flash memory 100 using the status read command. In addition, the memory controller 200 increases the erase count Era_counter with regard to the erase target block in the table by 1, and resets the sampling count Sampling_counter to 0.

When a string, which is previously registered as the last string, has not changed to a bad string (Yes in step S13), the memory controller 200 determines whether or not there is another string, which has changed to a bad string, in the erase target block (step S15).

If there is another new bad string (Yes in step S15), the memory controller 200 determines whether or not a current situation requires a lot of processes which are immediately necessary (for example, a garbage collection process) (step S16). When the current situation does not require a lot of processes (No in step S16), the memory controller 200 issues the erase command together with the last string acquisition directive command to the NAND flash memory 100. The last string acquisition directive command instructs that strings, excluding any bad strings which includes the bad string newly known in step S15, become targets.

The NAND flash memory 100, which received the last string acquisition directive command and the erase command, performs data erase, and acquires a new last string information (step S17). The last string information is also transmitted to the memory controller 200 using the dedicated acquisition command "xH" which is described in FIG. 10. In addition, the memory controller 200 increases the erase count Era_counter with regard to the erase target block in the table by 1, and resets the sampling count Sampling_counter to 0.

In a case in which the current situation requires a lot of processes (YES in step S16), the process proceeds to step S18. In addition, when there is no new bad string determined in step S15 (NO in step S15), the process proceeds to step S18.

In steps S18 and S19, the memory controller 200 performs erase while performing the erase verification only on the last string, and reviews the last string based on each certain erase frequency. That is, during when the erase frequency is included in a certain range, the memory controller 200 calculates a new last string for each certain frequency, and calculates the new last string at short intervals if the erase frequency increases. Further details are as follows.

In step S18, the memory controller 200 determines whether or not last string information needs to be updated. An update frequency depends on the erase frequency. For example, when it is assumed that N1<N2<N3<N4 and n1>n2>n3>n4, the memory controller 200 calculates the new last string in a case of erase corresponding to a frequency of a multiple of the natural number of n1 until the erase frequency is N1. Further, the memory controller 200 calculates the new last string in a case of erase corresponding to a frequency of a multiple of the natural number n2 until a threshold is N2, calculates the new last string in a case of erase corresponding to a frequency of a multiple of the natural number of n3 until the threshold is N3, and calculates the new last string in a case of erase corresponding to a frequency of a multiple of the natural number of n4 until the threshold is N4. Hereinafter, N5, N6 . . . , and n5, n6 . . . may be defined in the same manner.

In step S18, the memory controller 200 determines whether or not a condition used to calculate the new last string information is satisfied with reference to the erase count Era_counter with regard to the erase target block and the sampling count Sampling_counter. When the condition is not satisfied (NO in step S18), the memory controller 200 instructs the NAND flash memory to perform erase including the erase verification performed only on the last string. That is, the memory controller 200 transmits an erase command, which instructs that erase should be performed on the target block and the last string unit address is designated as the erase verification target, to the NAND flash memory 100.

The NAND flash memory 100, which receives the erase command, performs the erase verification on the designated string (last string) and repeats a loop to perform erase. If the last string passes the erase verification, the NAND flash memory 100 terminates the erase, and transmits a status, in which the erase is successful, to the memory controller 200. In addition, the memory controller 200 increases the erase count Era_counter with regard to the erase target block by 1, and resets the sampling count Sampling_counter to 0.

On the other hand, when the condition used to calculate the new last string information is satisfied (YES in step S18), the memory controller 200 issues an erase command together with the last string acquisition directive command to the storage device. For example, if the total erase frequency Era_counter is equal to or greater than 0 and less than N1, the condition is satisfied when the Sampling_counter is a multiple of n1. In addition, if the total erase frequency Era_counter is equal to or greater than N1 and less than N2, the condition is satisfied when the Sampling_counter is a multiple of n2. The last string acquisition directive command instructs that strings, excepting a bad string, become targets.

The NAND flash memory 100 which has received the command performs the erase and acquires the new last string information (step S20). The last string information is transmitted to the memory controller 200 using the status read command. In addition, the memory controller 200 increases the erase count Era_counter with regard to the erase target block by 1, and resets the sampling count Sampling_counter to 0.

2.3 Command Sequence

Figure 13:
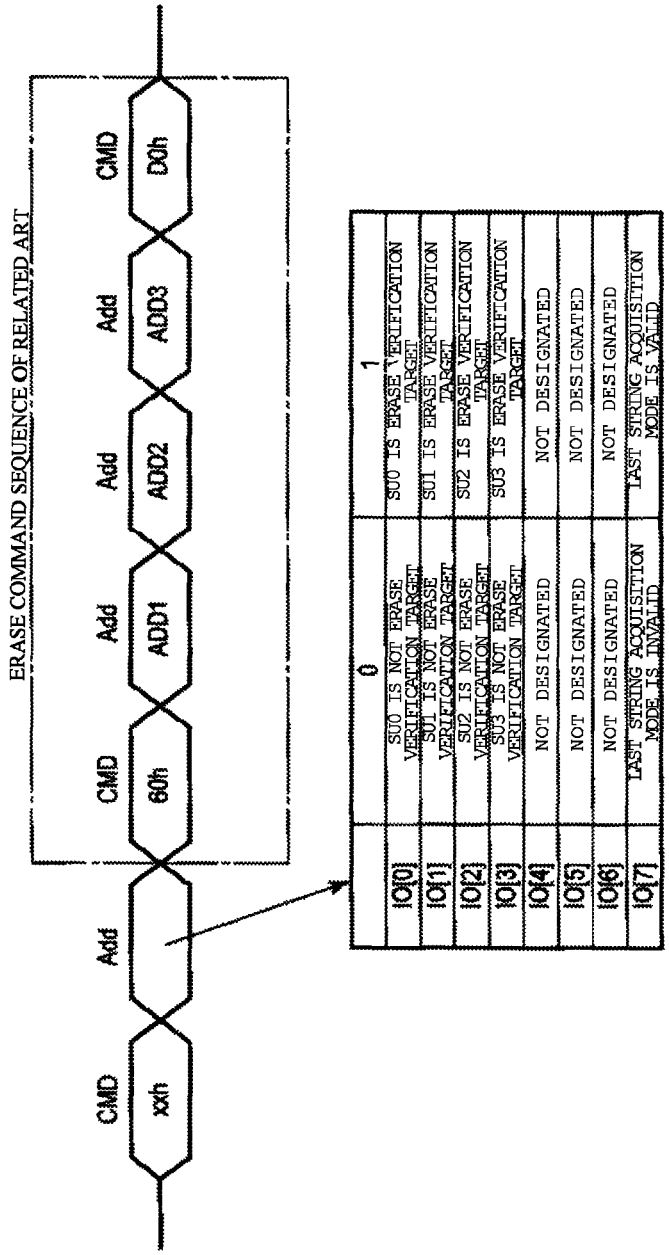
FIG. 13 is a view illustrating a command sequence according to the second embodiment.

A command sequence using the last string acquisition mode will be described with reference to FIG. 13.

As illustrated in the drawing, before an erase command sequence, which is defined using a NAND interface according to the related art, is performed, the memory controller 200 issues a command xxh and an address. The address is, for example, an 8 bit signal. When a single block includes four string units, each of the bits of the address signal means the followings:

[0]: with regard to SU0, "1" is an erase verification target, and "0" is not the erase verification target.

[1]: with regard to SU1, "1" is an erase verification target, and "0" is not the erase verification target.

[2]: with regard to SU2, "1" is an erase verification target, and "0" is not the erase verification target.

[3]: with regard to SU3, "1" is an erase verification target, and "0" is not the erase verification target.

[6:4]: no particular designation

[7]: In correspondence to the validation/invalidation of the last string acquisition mode, "1" causes the last string acquisition mode to be valid and "0" causes the last string acquisition mode to be invalid.

For example, it is assumed that the string unit SU3 is registered as a bad string in a certain block BLK.

In an initial erase operation, for example, "87h" is issued as a command, and an erase operation is performed in which the string units SU0, SU1, and SU2 are the erase verification targets using the last acquisition mode (step S12). Therefore, it is possible for the memory controller 200 to acquire the last string information.

Thereafter, for example, "02h" is issued as a command, the last acquisition mode is disabled, and then an erase operation in which only the string unit SU1 becomes the erase verification target is performed (step S19). For example, when N1=1,000, the same erase operation is performed until the erase operation is performed 1,000 times.

In addition, when the string unit SU1 becomes a bad string before, for example, 800-th erase is performed (for example, when write is performed on a certain page of the string unit SU1, program failure occurs), for example, "85h" is issued as a command, and an erase operation, in which the string units SU0 and SU2 become the erase verification targets, is performed using the last acquisition mode (step S14). Therefore, it is possible for the memory controller 200 to acquire new string information.

2.4 Advantage According to Embodiment

In the configuration according to the embodiment, revision is periodically performed on the last string information. Further, a revision frequency is increased in accordance with deterioration experienced when there is an increase in the erase frequency. Therefore, the accuracy of last string information is improved, and thus it is possible to improve the reliability of the operation of the NAND flash memory 100.

In addition, there is a case in which a string unit SU, which has changed to a bad string after shipment, is generated. If so, when this string unit SU is subject to the erase verification, a user is capable of accessing this string unit SU. That is, the user is capable of ordering write operation for this string unit even if data of this string unit cannot be erased. Therefore an erroneous write may occur when the write operation is further performed for a page including this string unit SU.

However, in the embodiment, the erase verification is periodically performed on all of the string units SU (excluding a string unit SU which is previously determined to be a bad string). Therefore, it is possible to deal with such a problem.

3. Modification Example

As above, the semiconductor memory device 100 according to the embodiment includes the plurality of string units SU each of which is a set of NAND strings in which the plurality of memory cells are stacked; the block BLK that includes the plurality of string units SU and that is a data erase unit; and the register 122 which holds erase property information for each string unit SU when data is erased. The register 122 is capable of outputting the erase property information to the memory controller 200.

According to the configuration, it is possible to appropriately output last string information to the memory controller. Therefore, it is possible to cause the number of string units, which become erase verification targets, to be minimum, it is possible to accelerate the speed of the erase operation, and it is possible to improve the performance of the NAND flash memory.

Meanwhile, an example of the case, in which the erase frequency is counted and revision is performed on the last string information based on the counted erase frequency, is described in the second embodiment. However, revision may be performed in combination with a write frequency as well as the erase frequency, or a case in which only the write frequency is taken into consideration instead of the erase frequency may be used.

Further, the embodiment is not limited to the NAND flash memory and may be applied to general semiconductor memory devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller that controls a semiconductor memory device including a plurality of string units, each of which includes a plurality of strings of memory cells connected in series, the memory controller comprising:
a control unit configured to issue a first command including first address data to the semiconductor memory device during a first phase, and a second command including second address data to the semiconductor memory device during a second phase after the first phase,
wherein the second command is a command to perform an erase operation on a block including a plurality of string units indicated by the second address data, and the first command specifies through the first address data whether or not each of the strings units is an erase verify operation target.

2. The memory controller according to claim 1, wherein the first address data includes a plurality of bit data, each bit data specifying whether or not one of the string units is the erase verify operation target.

3. The memory controller according to claim 1, wherein the control unit is configured to issue a third command including third address data to perform the erase operation after issuing the second command.

4. The memory controller according to claim 1, wherein the control unit is configured to issue a third command to the semiconductor memory device to cause the semiconductor memory device to return information about an erase characteristic of each of the string units, and the information includes an erase loop frequency at the time one of the string units passed the erase verify operation.

5. The memory controller according to claim 4, wherein the information further includes address data of the one of the string units.

6. The memory controller according to claim 1, wherein the plurality of string units in the block includes a first string unit and a second string unit, and the first address data indicates whether or not the first string unit is an erase verify operation target and whether or not the second string unit is an erase verify operation target.

7. A method of controlling a semiconductor memory device including a plurality of string units, each of which includes a plurality of strings of memory cells connected in series, comprising:
issuing a first command including first address data to the semiconductor memory device during a first phase; and
issuing a second command including second address data to the semiconductor memory device during a second phase after the first phase,
wherein the second command is a command to perform an erase operation on a block including a plurality of string units indicated by the second address data, and the first command specifies through the first address data whether or not each of the strings units is an erase verify operation target.

8. The method according to claim 7, wherein
the first address data includes a plurality of bit data, each bit data specifying whether or not one of the string units is the erase verify operation target.

9. The method according to claim 7, wherein
the control unit is configured to issue a third command including third address data to perform the erase operation after issuing the second command.

10. The method according to claim 7, wherein
the control unit is configured to issue a third command to the semiconductor memory device to cause the semiconductor memory device to return information about an erase characteristic of each of the string units, and
the information includes an erase loop frequency at the time one of the string units passed the erase verify operation.

11. The method according to claim 10, wherein
the information further includes address data of the one of the string units.

12. The method according to claim 7, wherein the plurality of string units in the block includes a first string unit and a second string unit, and the first address data indicates whether or not the first string unit is an erase verify operation target and whether or not the second string unit is an erase verify operation target.

* * * * *